United States Patent [19]

Cao et al.

[11] Patent Number: 5,214,389
[45] Date of Patent: May 25, 1993

[54] MULTI-DIMENSIONAL HIGH-RESOLUTION PROBE FOR SEMICONDUCTOR MEASUREMENTS INCLUDING PIEZOELECTRIC TRANSDUCER ARRANGEMENT FOR CONTROLLING PROBE POSITION

[75] Inventors: Beatrice M. Cao, Phoenix; Juan P. Carrejo, Tempe, both of Ariz.

[73] Assignee: Motorola, Inc., Schaumburg, Ill.

[21] Appl. No.: 817,209

[22] Filed: Jan. 6, 1992

[51] Int. Cl.$^5$ .............................. G01R 27/14
[52] U.S. Cl. ...................... 324/719; 324/72.5; 324/158 P; 324/713; 324/724
[58] Field of Search ............. 324/691, 713, 715, 716, 324/719, 724, 72.5, 158 D, 158 P, 158 R; 250/306, 307

[56] References Cited

U.S. PATENT DOCUMENTS

| | | | |
|---|---|---|---|
| 4,941,753 | 7/1990 | Wickramasinghe | 324/158 D X |
| 4,992,728 | 2/1991 | McCord et al. | 324/158 P |
| 5,017,266 | 5/1991 | Zdeblick et al. | 156/643 |

FOREIGN PATENT DOCUMENTS

| | | | |
|---|---|---|---|
| 0421437 | 4/1991 | European Pat. Off. | 324/724 |
| 55-60869 | 5/1980 | Japan | 324/719 |

OTHER PUBLICATIONS

M. Fotino, "Nanometer-Sized Tungsten Tips For STM and AFM", Proceedings of the 49th Annual Meeting of the Electron Microscopy Society of America, 1991, pp. 386–387.

Primary Examiner—Gerard R. Strecker
Assistant Examiner—Diep Do
Attorney, Agent, or Firm—Joe E. Barbee

[57] ABSTRACT

A probe which is positioned in at least one axis by a piezoelectric transducer is provided. One or more piezoelectric transducers control position of the probe with respect to another probe, with respect to a sample surface, or with respect to a previous position of the probe itself. A method for measuring spreading resistance is provided where the distance between two probes is reproducibly controlled in the range of a few angstroms by measuring tunneling current between the two probes, and electrical contact between the two probes and a sample is reproducibly provided by monitoring current between the probes and the sample.

14 Claims, 2 Drawing Sheets

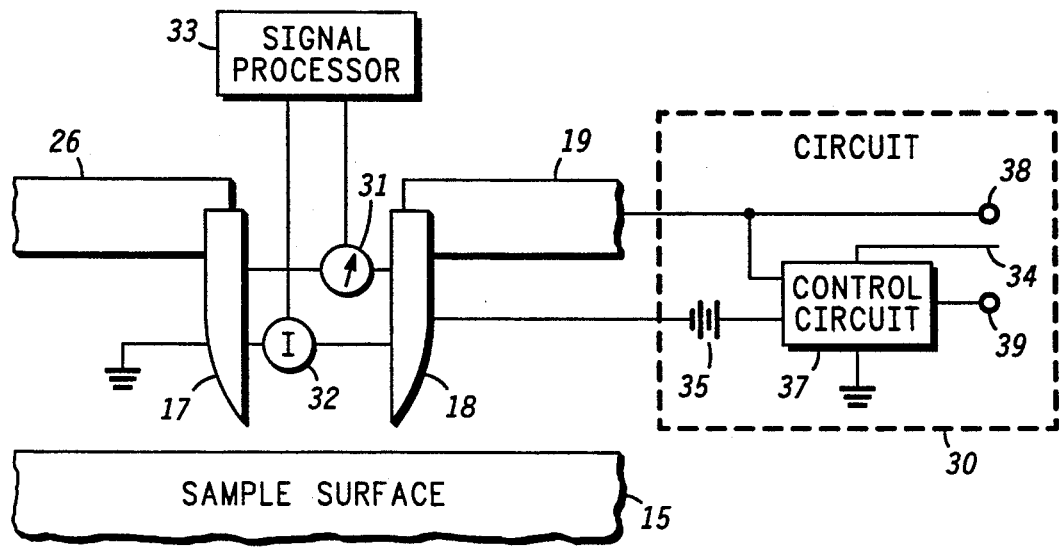
FIG. 2
FIG. 3
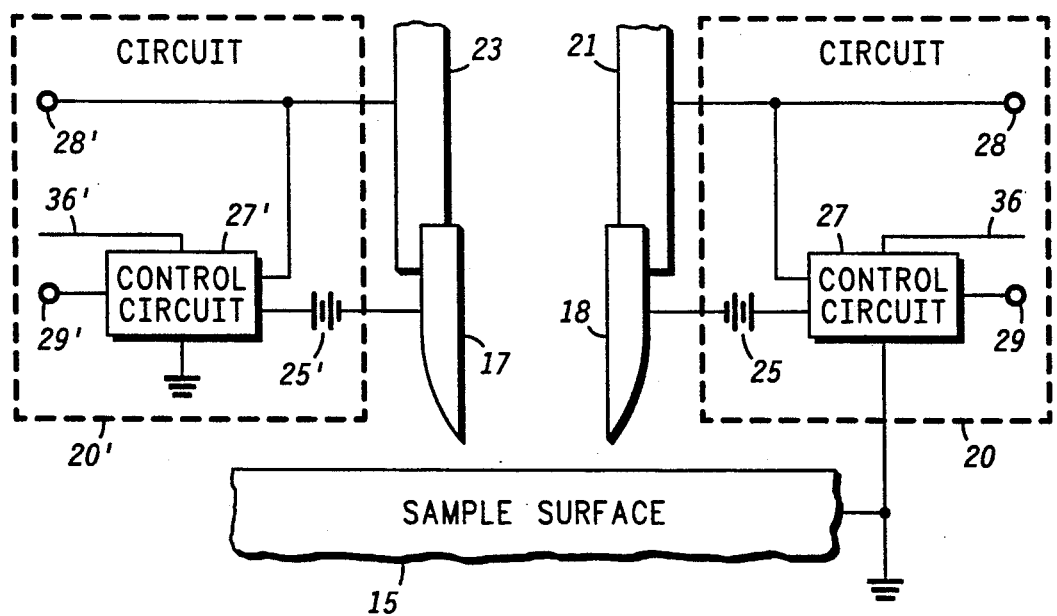

MULTI-DIMENSIONAL HIGH-RESOLUTION PROBE FOR SEMICONDUCTOR MEASUREMENTS INCLUDING PIEZOELECTRIC TRANSDUCER ARRANGEMENT FOR CONTROLLING PROBE POSITION

BACKGROUND OF THE INVENTION

The present invention relates, in general, to probes, and more particularly, to probes positioned using piezoelectric transducers.

In general, the resistivity of a grown or diffused layer in a semiconductor, the resistivity of a metallic film, or the resistivity of an electrically conductive film, is an important parameter which represents the electrical characteristics of these materials. In particular, spreading resistance is often used to measure thickness of diffused or epitaxial layers, and for establishing the impurity profile for these structures. Spreading resistance is the resistance associated with the divergence of the current lines which emanate when a small-tipped electrical probe is placed onto a semiconducting or conducting surface.

Commercially available spreading resistance probe (SRP) apparatus usually use two probes. The two probes are carefully machined to provide a controlled shape and size. The two probes are mounted in a fixed relationship to each other, typically about twenty micrometers apart and the probes are in the same plane. Because non-reproducible contact resistance between the probes and the sample causes measurement error, the probes are usually forced into the sample surface with a gravity load to provide a reproducible ohmic contact between the probes and the sample surface.

A known current is applied between the two probes, and the voltage drop is measured across these probes to obtain a spreading resistance. A major use of SRPs is to determine doping profiles of diffused layers. This is accomplished by angle lapping a sample to provide a beveled surface and then making spreading resistance measurements along the length of the bevelled surface. Previous SRP apparatus use pneumatic drive means to position the probes in relation to the sample and to move the probes along the length of the bevelled surface.

One disadvantage of previous SRPs is that spacing between the probes is difficult to control, and is quite large by modern device standards. Many semiconductor devices have diffused structures which are only a few microns or less in size. Thus, an SRP with probe spacing of twenty microns could not be used. Prior SRPs do not provide any method to accurately monitor the probe tip spacing during calibration and testing. Moreover, because the probes are in a fixed position with respect to each other, it is very difficult to make spreading resistance measurements in two dimensions. Because lateral diffusion in modern small geometry devices is as important to device performance as vertical diffusion, it is desirable to be able to accurately measure spreading resistance in two dimensions.

Another disadvantage of previous SRPs is that because the probes are forced into the sample surface with a fixed and significant force, the surface of the sample is damaged with unpredictable effects on measurement accuracy. Because the probes penetrate 0.005–0.01 micrometer into the sample surface, only a few measurements can be taken on a junction which is on the order of 0.1 micrometer deep. Also, the large force damages fine-tipped probes, requiring the use of large diameter probes. Large diameter probes, as set out above, require correspondingly large spacing between the probes.

An additional disadvantage of previous SRP apparatus is that the pneumatic drives used to position the probes provide limited precision in positioning the probes resulting in limited resolution and accuracy of the impurity profiles calculated from the spreading resistance measurements. Improved depth resolution results from minimal incremental position changes when moving the probes along the length of the bevelled surface. However, conventional pneumatic drives provide only relatively large incremental position changes and correspondingly limited depth resolution.

Accordingly, it is desirable to have an SRP apparatus that has probes which can be multi-dimensionally positioned with high-resolution, that minimizes penetration depth into a sample surface, that is compact and does not produce vibrations.

SUMMARY OF THE INVENTION

Briefly stated, the present invention is achieved by a probe having position controlled in at least one axis by a piezoelectric transducer (PZT). One or more PZTs control position of the probe with respect to another probe, with respect to a sample surface, or with respect to a previous position of the probe itself.

A method for measuring spreading resistance is provided where the distance between two probes is reproducibly controlled in the range of a few angstroms by measuring tunneling current between the two probes, and electrical contact between the two probes and a sample surface is reproducibly provided by monitoring tunneling current between the probes and the sample surface.

BRIEF DESCRIPTION OF THE DRAWINGS

FIG. 2 is a block diagram of a portion of a probe in accordance with the present invention; and FIG. 3 is a block diagram of another portion of a probe in accordance with the present invention.

DETAILED DESCRIPTION OF THE DRAWINGS

Figure 1:
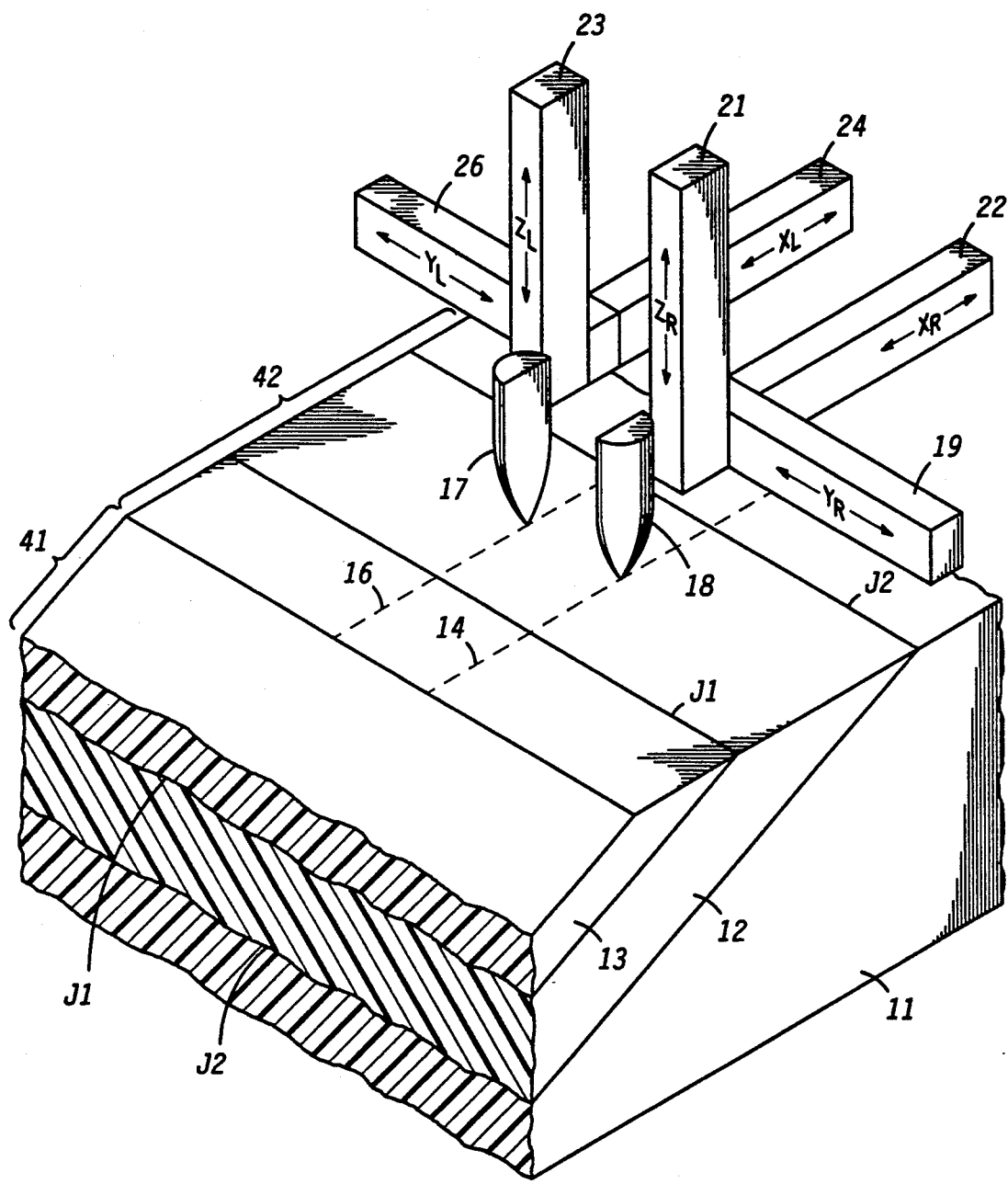
FIG. 1 is a perspective view of a portion of a multi-dimensional high-resolution probe in accordance with the present invention.

FIG. 1 is a highly simplified perspective view of a portion of a multi-dimensional high-resolution probe in accordance with the present invention. FIG. 1 illustrates an example of the mechanical arrangement of elements of a two-probe spreading resistance probe (SRP). Electrical coupling needed for control circuitry and measurement functions are illustrated in FIG. 2 and FIG. 3. While the present invention is described in terms of a SRP, it should be understood that other similar measurement systems such as four-point probes and the like can take advantage of the probe positioning features of the present invention, with only minor modifications to the present invention. Accordingly, such modifications are intended to be within the scope of the present invention. FIG. 1 shows a first probe 17 and a second probe 18 which are similar to probes used in conventional SRP apparatus or in scanning tunneling microscopy (STM) apparatus or atomic force microscopy apparatus. Probes and 18 may be ground flat on one side, as illustrated, to allow them to be positioned closer to each other. The actual shape and size of probes 17 and 18 can vary widely to adapt to the particular needs of the application. Probes 17 and 18 comprise a durable conductive material such as tungsten. An example of probes which are acceptable for use with the present invention is shown in M.Fotino, "NANOMETER-SIZED TUNGSTEN TIPS FOR STM AND AFM", published in the Proceedings of the 49th Annual Meeting of the Electron Microscopy Society of America, pages 386-7, 1991.

Probe 17 is attached to a piezoelectric transducer (PZT) 23, hereinafter referred to as Z-PZT 23 because it moves the probe in a Z-axis. PZTs are designed to expand, contract, or otherwise deform in a predetermined manner in response to an applied electric field. It is possible for a single PZT to control motion in two or three dimensions, as is shown in U.S. Pat. No. 5,017,266 entitled "METHOD OF MAKING AN INTEGRATED SCANNING TUNNELING MICROSCOPE" issued to M. Zdeblick and T. Albrecht on May 21, 1991. Such a multi-dimensional PZT is suitable for use in the present invention, although the simpler arrangement illustrated in FIG. 1 is believed to be sufficient.

Probe needle 17 is also mechanically coupled to Y-PZT 26, which moves probe 17 in the Y-axis and X-PZT 24, which moves probe 17 in an X-axis. Because X-PZT 24, Y-ZT 26, and Z-PZT 21 function independently, it is only important that they each are mechanically coupled to probe 18, and great flexibility exists as to the actual mechanical attachment of the elements to each other. Together, PZTs 23, 24 and 26 are capable of moving probe 17 in three dimensions. Probe 18 is attached to Z-PZT 21, Y-PZT 19, and X-PZT 22 and can move in three dimensions as described in reference to probe 17.

In accordance with the present invention, all fine movement of probe needles 17 and 18 is provided by PZTs. Commercially available PZTs, widely used in scanning-tunneling microscopes, have a sensitivity of about ten to twenty angstroms per volt. A 50-100 millivolt signal applied to one of the PZTs will move either probe 17 or 18 about one angstrom in a desired direction. PZTs are available with a total range of 160 micrometer linear scan, thus each probe 17 or 18 can be moved a total distance of 160 micrometers with position accuracy in the range of an angstrom. Because the PZTs operate without vibration, as do pneumatic drives, and the PZTs have little hysteresis, position accuracy can be maintained and repeated for long periods of time.

Probe movements greater than 160 micrometers, as are required when setting up a probe, can be provided by a mechanical coarse positioning apparatus (not shown). The PZTs can be mounted on the coarse positioning apparatus which will allow probes 17 and 18 to be moved distances which are outside the linear scan range of the PZT. Previous SRP apparatus allow only course adjustment of the relative position between two probes. By using PZTs, fine position control of probes 17 and 18 is provided. Prior SRP apparatus use needles which are in a fixed position with respect to each other during operation. In accordance with the present invention, each probe 17 and 18 can be moved independently and finely adjusted in three dimensions during operation. Fine position control of probes 17 and 18 allows the probes to be spaced only a few tens of angstroms from each other if desired. Independent motion also allows one or both of probes 17 and 18 to be repositioned during measurement, to provide impurity profiles in several dimensions.

FIG. 1 illustrates a sample substrate 11 having diffused junctions J1 and J2 formed therein by diffused regions 12 and 13. Junctions J1 and J2 represent metallurgical junctions, not necessarily semiconductor junctions, as diffused regions 12 and 13 may be of the same conductivity type as substrate 11. Sample substrate 11 has an upper surface 41. A beveled surface 42, alternatively referred to as the sample surface, is formed as is done in conventional SRP techniques to expose portions of junctions J1 and J2.

Probe 17 is brought into electrical contact with sample surface 42 at positions indicated by dashed line 16. Similarly, probe 18 is brought into electrical contact with sample surface 42 at positions indicated by dashed line 14. Referring now to FIG. 2, an SRP measurement is taken by forcing a known current using a current source 32 between probes 17 and 18 while they are in electrical contact with sample surface 42, and measuring the voltage using a voltmeter 31 between probes 17 and 18. Spreading resistance measurements are taken along the length of sample surface 42 and used to calculate an impurity profile for substrate 11 and diffused regions 12 and 13.

FIG. 2 and FIG. 3 illustrate a method of using a multi-dimensional high-resolution probe in accordance with the present invention. The elements of FIGS. 2 and 3 that are the same as FIG. 1 have the same reference numerals used in FIG. 1. A circuit 30, identified by a dashed box in FIG. 2 is used for detecting the position of probe 18 with respect to probe 17 and for applying an electric field to Y-PZT 19 to control relative position of probes 18 and 19. After probes 17 and 18 are coarsely positioned over a sample surface 15 as described hereinbefore, a Y-axis control circuit 37 is activated by an external signal provided on control input 34 to perform fine positioning. Probe 17 is coupled to ground; and probe 18 is coupled to a bias voltage 35. Bias voltage 35 is coupled to ground through to Y-axis control circuit 37 so that it can be decoupled to allow probe 18 to have a floating potential when not in use. Bias voltage 35 provides a voltage between probe 17 and probe 18. Y-axis control circuit 37 applies an electric field, which can be controllably varied, to Y-PZT 19. The electric field causes Y-PZT 19 to move probe 18 toward probe 17.

Voltage at output 38 is proportional to the position of probe 18. Output 39 is used to monitor tunneling current flowing between probe 17 and probe 18. Tunneling current rises exponentially as probe 18 approaches within a few tens of angstroms of probe 17, and so is a very sensitive gauge of the separation distance between probes 17 and 18. Probes 17 and 18 are moved towards each other until the tunneling current reaches a predetermined value, which is correlated to a known separation. Once this reference position is found, control circuit 37 can modify the electric field on Y-PZT 19 to provide any desired separation between probes 18 and 17 within the linear scan range of Y-PZT 19. It is important that Y-PZT 19 is highly linear. Once the reference position is determined, Y-axis control circuit disconnects bias voltage 35 so it will not interfere with measurements.

Operation and control of X-PZT 22 and X-PZT 24 is substantially similar to that described for Y-PZT 19 in FIG. 2. In other words, control of X-PZT 22 and X-PZT 24 is achieved by a circuit substantially similar or identical to circuit 30 shown in FIG. 2, and so are not separately illustrated. X-PZT 22 and X-PZT 24 function to align and move probes 17 and 18 in the X-direction, or coming out of the page as shown in FIG. 2.

After the separation between probes 17 and 18 is performed, the probes are moved towards sample surface 15 using a Z-axis control circuit 27 shown in FIG. 3.

A circuit 20, identified by a dashed box in FIG. 3 is used for detecting the position of probe 18 with respect to sample surface 15 and for applying an electric field to Z-PZT 21 to control vertical position of probe 18. A bias voltage is applied to probe 18, and sample surface 15 is coupled to ground. Bias voltage 25 is reference to ground potential through control circuit 37, allowing bias voltage 25 to be applied between probe 18 and sample surface 15, which is also coupled to ground. Z-axis control circuit 27 is activated by an external signal provided on control input 36 and applies a variable electric field to Z-PZT 21 to move probe 18 up and down with respect to surface 15. Output 28 is used to monitor the electric field on Z-PZT 21 and thus the position of Z-PZT 21. Output 29 monitors tunneling current between probe 18 and sample surface 15. Probe 18 can be moved arbitrarily close to sample surface 15. As probe 18 touches surface 15, at first a schottky contact is made between probe 18 and surface 21. As more force is applied by Z-PZT 21, an ohmic contact is made between probe 18 and surface 15. Current between probe 18 and surface 15 increases exponentially as an ohmic contact is made, so that current monitored at output 29 is a sensitive indicator of contact impedance.

Probe 17 is attached to Z-PZT 23 and is moved in relation to surface 15 in a manner similar to probe 18. A circuit 20', identified by a dashed box in FIG. 3 is used for detecting the position of probe 17 with respect to sample surface 15 and for applying an electric field to Z-PZT 23 to control relative vertical position of probe 17. All of the component elements of circuit 20' are the same as previously described for circuit 20, and labeled using the same numbers as circuit 20 but bear a prime designation to distinguish circuit 20' from circuit 20.

An important advantage of an apparatus in accordance with the present invention is current between probe 18 and surface 15 can be monitored at output 29 to determine precisely when a reproducible ohmic contact is made. This avoids the previous method of dropping the probe onto the sample surface with a large known force to ensure ohmic contact. Using Z-PZT 21 to apply force to probe 18, penetration of probe 18 into surface 15 is minimized, greatly improving depth resolution and measurement distortion caused by large penetration depths. Also, smaller diameter probes can be used, and useful life of probes 17 and 18 is expected to be much greater.

Once probes 17 and 18 are in electrical contact with surface 15, spreading resistance measurements are taken using the measurement techniques described in reference to FIG. 1. Once a measurement is performed, probes 17 and 18 may be lifted from surface 15 to the coarse position, and relocated to a new position using X-PZTs 22 and 24 shown in FIG. 1.

Alternatively, it may be possible to make spreading resistance measurements without physical contact between probes 17 and 18 and the sample surface. This may be possible by positioning probes 17 and 18 so close to surface 15 that a current can be established in sample surface 15 by tunneling current from probes 17 and 18. Because such a non-contact spreading resistance measurement mandates that probes 17 and 18 be positioned within a few angstroms of sample surface 15, it is impossible using conventional SRP apparatus. Of course, the contact between probes 17 and 18 will be non-ohmic if probes 17 and 18 do not make physical contact. It is believed that the effects of the non-ohmic contact can be compensated for because Z-PZTs 21 and 23 can provide a highly reproducible non-ohmic contact such that the effects of the non-ohmic contact can be minimized by modifying the computations used to calculate impurity profiles. One advantage of the non-contact SRP measurement is that probes 17 and 18 may be moved in the X-axis without lifting, but instead by scanning X-PZTs 22 and 24 while taking a series of spreading resistance measurements. Also, a non-contact measurement eliminates errors caused by damage to the sample surface.

Another feature of the apparatus in accordance with the present invention is that Y-PZTs 19 and 26 can be used to scan probes 17 and 18 in the Y-axis while making a series of spreading resistance measurements. This technique allows the separation distance between probes 17 and 18 to be controllably varied while taking a series of measurements allowing a Y-axis impurity profile to be calculated. By moving probes 17 and 18 in both the X-axis and the Y-axis, a two dimensional impurity profile of a junction can be calculated. Because the spacing between probes 17 and 18 is controlled to within a few angstroms, device structures with sub-micrometer features can be accurately profiled.

While the invention is described with specific preferred embodiments, it is evident that many alternatives and variations will be apparent to those skilled in the semiconductor arts. More specifically the invention has been described for a spreading resistance probe apparatus, although the method is directly applicable to other probe apparatus.

By now it should be appreciated that there is provided a probe apparatus which can be positioned with high accuracy and moved with high-resolution in several dimensions. A spreading resistance probe in accordance with the present invention provides impurity profiles of sub-micrometer geometry device structures having junction depths of only a few hundred angstroms. Compact piezoelectric transducers are used to move probes resulting in a spreading resistance probe which is vibration free and extremely small. Highly accurate and reproducible probe positioning is achieved by monitoring tunneling current between the probes and between the probes and a sample surface, providing high-resolution spreading resistance profiles.

We claim:

1. A multi-dimensional high-resolution probe comprising: a first probe; a first piezoelectric transducer attached to the first probe, wherein the first piezoelectric transducer is capable of moving the fist probe in at least one dimension; a first means for applying a variable electric field to the first piezoelectric transducer; a second probe; a second piezoelectric transducer attached to the second probe; a second means for applying a variable electric field to the second piezoelectric transducer; a means for applying current between the first and second probes; and a means for measuring voltage between the first and second probes.

2. The multi-dimensional high-resolution probe of claim 1 further comprising a means for calculating spreading resistance by dividing the measured voltage by the measured current.

3. The multi-dimensional high-resolution probe of claim 1 further comprising a means for detecting the relative position of at least one of the probes with respect to a conductive or semiconductive body including: a means for applying a bias voltage between the at least one probe and the conductive or semiconductive body; and a means for monitoring tunneling current between the at least one probe and the conductive or semiconductive body, wherein relative position is proportional to the monitored tunneling current.

4. The multi-dimensional high-resolution probe of claim 1 wherein the first and second piezoelectric transducers are capable of three dimensional motion.

5. The multi-dimensional high-resolution probe of claim 1 further comprising a third piezoelectric transducer attached to the first probe, wherein the first and third piezoelectric transducers are attached to each other and to the first probe to allow moving the first probe in at least two dimensions.

6. The multi-dimensional high-resolution probe of claim 5 further comprising a fourth piezoelectric transducer attached to the first probe, wherein the first, third, and fourth piezoelectric transducers are attached to each other and the first probe to allow moving the first probe in at least three dimensions.

7. The multi-dimensional high-resolution probe of claim 6 wherein each of the first, third, and fourth piezoelectric transducers are electrically coupled to a means for applying an electric field.

8. The multi-dimensional high-resolution probe of claim 1 further comprising a means for detecting the relative position of the first probe with respect to the second probe including: a means for applying bias voltage between the first and second probes, wherein the means of applying a bias voltage drives a tunneling current between the first and second probes; and a means for monitoring the tunneling current between the first and second probes, wherein distance between the probes is proportional to the measured tunneling current.

9. A multi-dimensional high-resolution probe for semiconductor spreading resistance measurements comprising: a firs probe; a first piezoelectric transducer attached to the first probe; a first control circuit for applying a variable electric field to the first piezoelectric transducer; a second probe; a second piezoelectric transducer attached to the second probe; and a second control circuit for applying a variable electric field to the second piezoelectric transducer; a first bias voltage source coupled between the first probe and a semiconductor sample, wherein the first bias voltage source drives a tunneling current between the first probe and the semiconductor sample; a first means for monitoring the tunneling current between the first probe and the semiconductor sample; a second bias voltage source coupled between the second probe and the semiconductor sample, wherein the second bias voltage source drives a tunneling current between the second probe and the semiconductor sample; a means for monitoring the tunneling current between the second probe and the semiconductor sample; a third bias voltage source coupled between the first and second probes, wherein the third bias voltage source drives a tunneling current between the first and second probes; a means for monitoring the tunneling current between the first and second probes; a means for measuring spreading resistance between the first and second probes when the probes are in electrical contact with the semiconductor sample.

10. A method for making high-resolution spreading resistance measurements comprising the steps: providing a sample surface to be measured; providing first and second probes; moving the first probe in a vertical Z-axis to a coarse distance over the sample surface; moving the second probe in the Z-axis to a coarse distance over the sample surface; monitoring a first tunneling current between the first and second probes; moving the first and second probes in a Y-axis towards each other until the first tunneling current reaches a first predetermined magnitude; monitoring a second current between at least one of the probes and the sample surface; moving the first and second probes towards the sample surface in the Z-axis until the second current reaches a second predetermined magnitude; measuring spreading resistance between the first and second probes; and moving the probes in an X-axis, wherein the steps of measuring spreading resistance and moving the probes in an X-axis are performed more than one time.

11. The method of claim 10 further comprising the steps of lifting the probes to the coarse position before the step of moving the probes in the X-axis, and moving the probes towards the sample surface in the Z-axis until the second current reaches the second predetermined value after the step of moving the probes in the X-axis.

12. The method of claim 10 wherein the sample surface comprises a semiconductor body having diffused junctions therein, wherein the sample surface is provided by bevelling the semiconductor body to expose the diffused junctions.

13. The method of claim 10 further comprising the steps of moving the probes to a new location in the Y-axis before the step of moving the probes in the X-axis, and repeating the step of measuring spreading resistance between the probes while the probes are in the new location in the Y-axis.

14. The method of claim 10 wherein the second predetermined magnitude of the second current correlates to ohmic contact between the first and second probes and the sample surface.

* * * * *